United States Patent
Bertrand et al.

(10) Patent No.: US 11,594,995 B2
(45) Date of Patent: Feb. 28, 2023

(54) SYSTEM FOR CONTROLLING A VOLTAGE CONVERTER

(71) Applicant: Valeo Equipements Electriques Moteur, Creteil (FR)

(72) Inventors: Mathieu Bertrand, Creteil (FR); Yann Lecocq, Creteil (FR); Hicham Lahbil, Creteil (FR)

(73) Assignee: Valeo Equipements Electriques Moteur, Creteil (FR)

( * ) Notice: Subject to any disclaimer, the term of this patent is extended or adjusted under 35 U.S.C. 154(b) by 0 days.

(21) Appl. No.: 17/414,911

(22) PCT Filed: Dec. 20, 2019

(86) PCT No.: PCT/EP2019/086775
§ 371 (c)(1),
(2) Date: Jun. 16, 2021

(87) PCT Pub. No.: WO2020/128029
PCT Pub. Date: Jun. 25, 2020

(65) Prior Publication Data
US 2022/0069758 A1     Mar. 3, 2022

(30) Foreign Application Priority Data

Dec. 20, 2018 (FR) ...................................... 1873476

(51) Int. Cl.
*H02H 7/08* (2006.01)
*H02P 29/024* (2016.01)
(Continued)

(52) U.S. Cl.
CPC .......... *H02P 29/0241* (2016.02); *B60L 3/003* (2013.01); *B60L 50/51* (2019.02);
(Continued)

(58) Field of Classification Search
CPC ............................ H02P 29/0241; B60L 50/51
(Continued)

(56) References Cited

U.S. PATENT DOCUMENTS

2008/0304189 A1   12/2008   Tang et al.
2010/0036555 A1   2/2010    Hosoda et al.
(Continued)

FOREIGN PATENT DOCUMENTS

EP        3002865 A2      4/2016
JP        2015084624 A    4/2015
(Continued)

OTHER PUBLICATIONS

International Search Report and Written Opinion issued in corresponding International Patent Application No. PCT/EP2019/086775, dated Apr. 20, 2020 (17 pages).
(Continued)

*Primary Examiner* — Erick D Glass
(74) *Attorney, Agent, or Firm* — Osha Bergman Watanabe & Burton LLP (57) ABSTRACT

The invention relates to a system 1 for controlling a voltage converter comprising a plurality of high-side switches forming a high group and a plurality of low-side switches forming a low group, the control system 1 comprising:
- a module 10 for measuring a voltage V of the DC voltage source B,
- a module 11 for comparing the measured voltage V with a first safety threshold OV1,
- a control module 12 for controlling a first group of switches so as to close chosen from the high group or the low group, if the comparison module 11 indicates that the measured voltage V is higher than the first safety threshold OV1.

9 Claims, 4 Drawing Sheets

(51) Int. Cl.
  *B60L 50/51* (2019.01)
  *B60L 3/00* (2019.01)
  *G01R 19/165* (2006.01)
  *H02H 7/122* (2006.01)
  *H02P 3/18* (2006.01)
  *H02P 11/06* (2006.01)
  *H02P 27/06* (2006.01)

(52) U.S. Cl.
  CPC ..... *G01R 19/16538* (2013.01); *H02H 7/1227* (2013.01); *H02P 3/18* (2013.01); *H02P 11/06* (2013.01); *H02P 27/06* (2013.01)

(58) Field of Classification Search
  USPC .................................................... 318/400.21
  See application file for complete search history.

(56) References Cited

U.S. PATENT DOCUMENTS

| | | |
|---|---|---|
| 2014/0021893 A1 | 1/2014 | Komatsu et al. |
| 2015/0280624 A1 | 10/2015 | Sotome |
| 2017/0237381 A1 | 8/2017 | Shinohara |
| 2017/0305274 A1 | 10/2017 | Saha et al. |

FOREIGN PATENT DOCUMENTS

| | | |
|---|---|---|
| JP | 2017-147806 A | 8/2017 |
| JP | 2017-195734 A | 10/2017 |

OTHER PUBLICATIONS

Notice of Reasons for Refusal in corresponding Japanese Application No. 2021-535638, dated Jun. 20, 2022 (8 pages).

SYSTEM FOR CONTROLLING A VOLTAGE CONVERTER

The present invention relates to electrical systems comprising a rotary electric machine for a motor vehicle, which machine is driven by a voltage converter. More specifically, it relates to a system for controlling a voltage converter and to an electrical system comprising a rotary electric machine and such a control system.

Voltage converters are known which comprise a control system and a plurality of switching arms connected in parallel, each arm comprising a high-side switch and a low-side switch connected to one another at a midpoint, each midpoint being intended to be connected to at least one phase of a rotary electric machine. The control system controls the opening or closing of each switch in order to control the supply of power to the electric machine. The low-side switches or the high-side switches are electronic power supply switches, for example of metal-oxide-semiconductor field-effect transistor (MOSFET) type. The switches allow the phases of a stator to be supplied with power, either in a motor mode from a battery supplying electricity to an on-board network of the vehicle, or in an alternator mode in order to supply the on-board network with power and charge a battery of the vehicle. In the case of an electric machine comprising three phases on the stator, the voltage converter comprises three low-side switches, each connected to one of the three phases and to ground, and three high-side switches, each connected to one of the three phases and to a positive terminal corresponding to the on-board network of the motor vehicle.

Following a fault in an item of electrical equipment of the motor vehicle connected to the on-board network, an overvoltage may occur on the on-board network, i.e. the appearance of a voltage on the on-board network that is much higher than the nominal voltage of this network.

For example, such an overvoltage may occur in the event of a malfunction of a switch of the voltage converter which remains in the open state or in the closed state when the control system controls it so as to be in the closed state or in the open state, respectively.

Such an overvoltage may damage or decrease the reliability not only of the rotary electric machine or of the voltage converter and of its control system, but also of any electrical devices connected to the on-board network.

To limit or stop the overvoltage, it is known that the system for controlling the electric machine comprises detection devices associated with each of the switches. Such a detection device makes it possible to detect and identify a fault in the switch with which it is associated and to control the closing and opening of the other switches depending on the identified fault in order to limit or stop the overvoltage.

For example, in the case of a high-side switch that remains in a closed state, the fault detector of this switch will detect a remained in closed state fault for this switch and transmit the information regarding detection of this fault to a control module of the control system which will control the closing of the other two high switches and thus make the rotary electric machine safe by putting all of the phases of the stator at the same potential (i.e. the phases are shorted).

However, such a control system has to include as many fault detectors as there are switches, which generates substantial cost and difficulties in housing these fault detectors within the control system.

SUMMARY OF THE INVENTION

The object of the invention is to at least partly overcome these drawbacks.

To that end, the invention relates to a system for controlling a voltage converter, the voltage converter being intended to connect a rotary electric machine to a DC voltage source, in particular to an on-board network, the voltage converter comprising a plurality of switching arms connected in parallel, each arm comprising a high-side switch and a low-side switch connected to one another at a midpoint that is intended to be connected to said rotary electric machine, the high-side switches forming a high group and the low-side switches forming a low group, the control system comprising:

1. a module for measuring a voltage of the DC voltage source,
2. a module for comparing the measured voltage with a first safety threshold,
3. a control module for generating a command to close a first group of switches, chosen from the high group or the low group, if the comparison module indicates that the measured voltage is higher than the first safety threshold.

What is meant by high-side or low-side switch is an electronic power supply switch, for example of IGBT (insulated-gate bipolar transistor) type or of metal-oxide-semiconductor field-effect transistor (MOSFET) type.

Thus, the control system protects the voltage converter and the rotary electric machine by systematically closing all of the switches of one and the same side when an overvoltage is detected.

Such a system, due to its systematic aspect, does not require the installation of fault detection and identification means at each switch. It is therefore less bulky and less expensive to implement than prior control systems.

In the case when the control system controls all of the switches of the low group so as to close when the measured voltage is higher than the first safety threshold, the voltage converter is thus protected when one of the high-side switches produces an open-circuit fault (the switch remains open regardless of the command that it receives) or when one of the low-side switches produces a short-circuit fault (the switch remains closed regardless of the command that it receives).

In the case when the control system controls all of the high-group switches so as to close when the measured voltage is higher than the first safety threshold, the voltage converter is thus protected when one of the high-side switches produces a short-circuit fault or when one of the low-side switches produces an open-circuit fault.

In both cases, the voltage converter is also protected against an overvoltage on the on-board network created by an item of equipment other than the voltage converter and/or the rotary electric machine.

The device according to the invention may also exhibit one or more of the features below, considered individually or according to all technically possible combinations:

According to one particular embodiment of the invention, when the measured voltage is higher than or equal to the first safety threshold, the control module is further designed to generate a command to open the switches other than those of the first group.

This is to prevent a short circuit and damage the switches of the voltage converter if one of the switches in the first group is faulty.

According to one embodiment, the measured voltage is the voltage of the DC voltage source. For example, the measurement module measures the voltage between two terminals of the voltage converter that are intended to be connected lo to the DC voltage source.

According to one embodiment, the first safety threshold is between 1.10 and 1.25 times the nominal voltage of the DC voltage source supplying the converter, for example 1.2 times the nominal voltage of the DC voltage source. For example, the nominal supply voltage is equal to forty-eight volts, and the first safety threshold is between fifty-three volts and sixty volts.

According to one embodiment, the comparison module compares the measured supply voltage with a second safety threshold higher than the first safety threshold and the control module is further designed to, when the measured voltage is higher than or equal to the second safety threshold, generate a command to close a second group of switches chosen from the group of the high-side switches or the group of the low-side switches, said second group of switches being different from said first group of switches.

Such a control system makes it possible to make the voltage converter safe when one of the switches of the voltage converter produces a short circuit or an open circuit.

In one variant of this embodiment, the control system is configured so as not to control the second group of switches so as to close before the first group of switches has been closed.

In one particular embodiment of the invention, the second safety threshold is between 1.2 and 1.4 times the nominal voltage of the DC voltage source of the voltage converter, for example 1.33 times the nominal voltage of the DC voltage source.

Thus, it remains within voltage values that do not result in damage to the components of the voltage converter.

In one exemplary implementation of this embodiment, the nominal voltage of the DC voltage source is equal to forty-eight volts and the second safety threshold is between fifty-eight and sixty-seven volts, for example sixty-four volts.

In another embodiment of the invention, the second safety threshold is equal to the sum of the first safety threshold and at least one voltage between four volts and twelve volts.

In another embodiment of the invention, the control module is further designed to generate a command to open the first group of switches when the measured voltage is higher than or equal to the second safety threshold.

This is to prevent a short circuit and damage the switches of the voltage converter.

In another embodiment of the invention, the switches of the first group remain closed when the measured voltage is higher than or equal to the second safety threshold. This makes it possible to cause a short circuit and to use either the short-circuit protection device of the vehicle, for example a fast-acting fuse, or one of the switches on each arm, damaging them until they are all open.

According to one embodiment, the first group of switches is the group of the low-side switches.

According to one embodiment, the first group of switches is the group of the high-side switches.

The invention also relates to a control unit for controlling the high-side and low-side switches, said control unit comprising a control system described above which may comprise features of one or more of the embodiments described above.

The invention also relates to an electrical system comprising:
a. a first and a second power supply terminal intended to be connected to a DC voltage source, in particular to a battery of a motor vehicle,
b. a rotary electric machine comprising a stator having at least three phases,
c. a voltage converter for supplying the rotary electric machine with power from said DC voltage source, the voltage converter comprising:
  i. a plurality of switching arms connected in parallel, each arm comprising a high-side switch and a low-side switch connected to one another at a midpoint, each midpoint being connected to at least one phase of said rotary electric machine, and
  ii. a unit for controlling the high-side and low-side switches, said control unit comprising a control system according to the invention.

The electrical system benefits from the same advantages, mentioned above, as the control system.

In one particular embodiment of the electrical system, the control unit further comprises at least one fault detection module, for example a phase-current direction fault module, and wherein, when the fault module detects a fault, the control unit controls the first group of switches so as to close.

In one particular embodiment of the electrical system, the control unit further comprises:
a controller designed to control the high-side and low-side switches,
a machine control module intended to receive, from an electronic control unit of the vehicle, an instruction either to switch the rotary electric machine to motor mode, or to switch the rotary electric machine to alternator mode, and arranged to transform this instruction into a command for controlling the high-side and low-side switches of the voltage converter,
a logic module for prioritizing the commands sent by the control system over the commands sent by the machine control module, the logic module transmitting, to the controller, the command for the switches received either by the machine control module or by the control system.

The use of a logic module ensures that the controller receives just one command and thus prevents a malfunction of the electrical system.

The invention also relates to a method for controlling a system for controlling a voltage converter according to the invention, the voltage converter being connected to a rotary electric machine and to a DC voltage source, in particular to an on-board network of a motor vehicle, said method comprising:
1. a step of measuring, by means of the measurement module, the voltage of the DC voltage source,
2. a step of comparing, by means of the comparison module, the measured so voltage with a first safety threshold, and
3. a step of generating, by means of the control module, a command to close a first group of switches chosen from the high group or the low group, if the measured voltage is higher than the first safety threshold.

The invention also relates to a method for making an electrical system safe, comprising an electric machine comprising a stator having at least three phases, a voltage converter for supplying the rotary electric machine with power from a DC voltage source, the voltage converter comprising:
1. a plurality of switching arms connected in parallel, each arm comprising a high-side switch connected to a positive terminal of the DC voltage source and a low-side switch connected to the ground of the vehicle or to a negative terminal of the DC voltage source, the low switch and the high switch of each arm being connected to one another at a midpoint, each midpoint being connected to at least one phase of said rotary electric machine, and 2. a control unit comprising a control system according to the invention with or without the features of the various embodiments, the method for making an electrical system safe comprises the steps:
1. of measuring a voltage of the DC voltage source,
2. of comparing the measured voltage with a first safety threshold,
3. of closing a first group of switches, chosen from the group of the high-side switches or the group of the low-side switches, when the measured supply voltage is higher than the first safety threshold.

BRIEF DESCRIPTION OF THE DRAWINGS

Other features and advantages of the invention will become clearly apparent from the following description, which is provided by way of a non-limiting example, with reference to the accompanying figures, in which.

For greater clarity, identical or similar elements are identified using identical reference signs in all of the figures.

DETAILED DESCRIPTION

Figure 1:
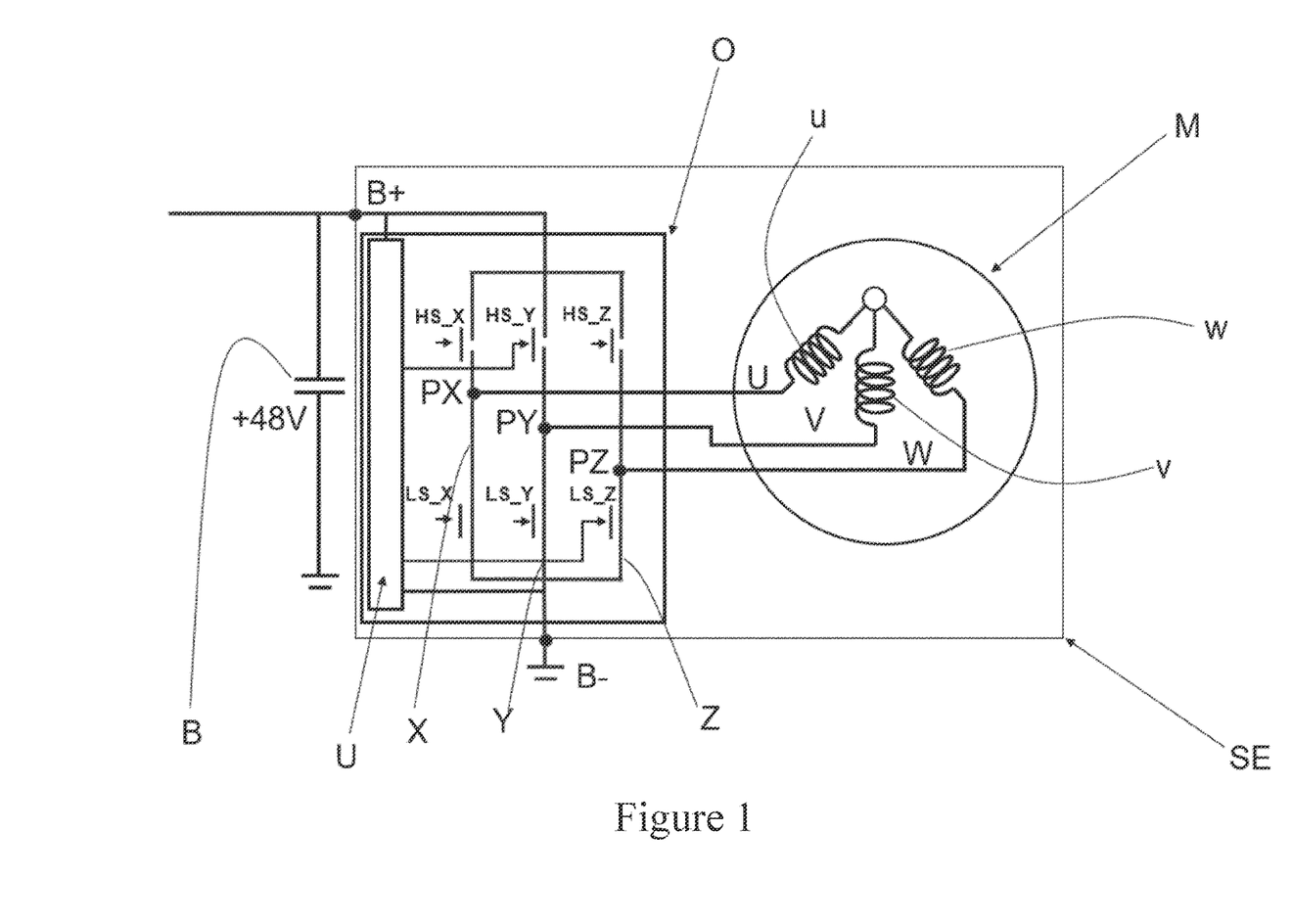
[FIG. 1] shows a block diagram of an electrical system comprising a control unit comprising a control system according to one example of a first embodiment.

[FIG. 1] shows a block diagram of an electrical system SE comprising a first power supply terminal B+ and a second power supply terminal B− that are connected to a DC power source B, in this case, in this example, a 48 V DC power source, for example a battery of a motor vehicle allowing other items of electrical equipment (not shown) of the vehicle to be supplied with power by means of an on-board network. The DC voltage source may comprise the battery of a motor vehicle and a capacitor bank connected in parallel with the battery of the vehicle. In this example, the second terminal B− is the ground of the electrical system SE.

The electrical system SE comprises a rotary electric machine M comprising a stator having at least three phases U, V, W and three coils u, v, w wound on the stator. In this example, the coils u, v, w are connected in star configuration and each comprise, at their output, the corresponding phase U, V, W, respectively.

The electrical system SE further comprises a voltage converter O for supplying the rotary electric machine M with power from said DC voltage source B.

The voltage converter O comprises a plurality of switching arms connected in parallel between the terminals B+ and B−. The voltage converter O comprises as many arms as the rotary electric machine M has phases. In this case, in the example described here, the voltage converter O comprises three arms. Thus, the voltage converter O comprises a first arm X, a second arm Y and a third arm Z.

Each arm X, Y, Z comprises a high-side switch HS_X, HS_Y, HS_Z and a low-side switch LS_X, LS_Y, LS_Z. Each high-side and low-side switch of an arm X, Y, Z is connected to the other at a midpoint PX, PY, PZ. The high-side switches form a switch group, called the high group HS. Likewise, the low-side switches form a switch group, called the low group BS.

In the example described here, each high-side or low-side switch is a metal-oxide-semiconductor field-effect transistor each comprising a flyback diode.

In this case, in this example, there is therefore, on the first arm X, a first high-side switch HS_X connected to a first low-side switch LS_X by a first midpoint PX, on the second arm Y, a second high-side switch HS_Y connected to a second low-side switch LS_Y by a second midpoint PY and a third high-side switch HS_Z, respectively connected to a third low-side switch LS_Z by a third midpoint PZ.

Each midpoint PX, PY, PZ is connected to at least one phase U, V, W of said rotary electric machine M, so in this case, in this example, the first midpoint PX to the phase U, the second midpoint PY to the phase V and the third midpoint Z to the phase W.

The voltage converter O further comprises a unit U for controlling the high-side HS_X, HS_Y, HS_Z and low-side LS_X, LS_Y, LS_Z switches. Said control unit U therefore comprises, for each switch, an output connected to the control for the corresponding switch. To avoid overloading FIG. 1, only the connection between an output of the control unit U and the control for the third low-side switch LS_Z and another output of the control unit U and the control for the second high-side switch HS_Y have been shown.

The control unit U controls the switches of each arm X, Y, Z via pulse-width modulation (PWM).

Figure 2:
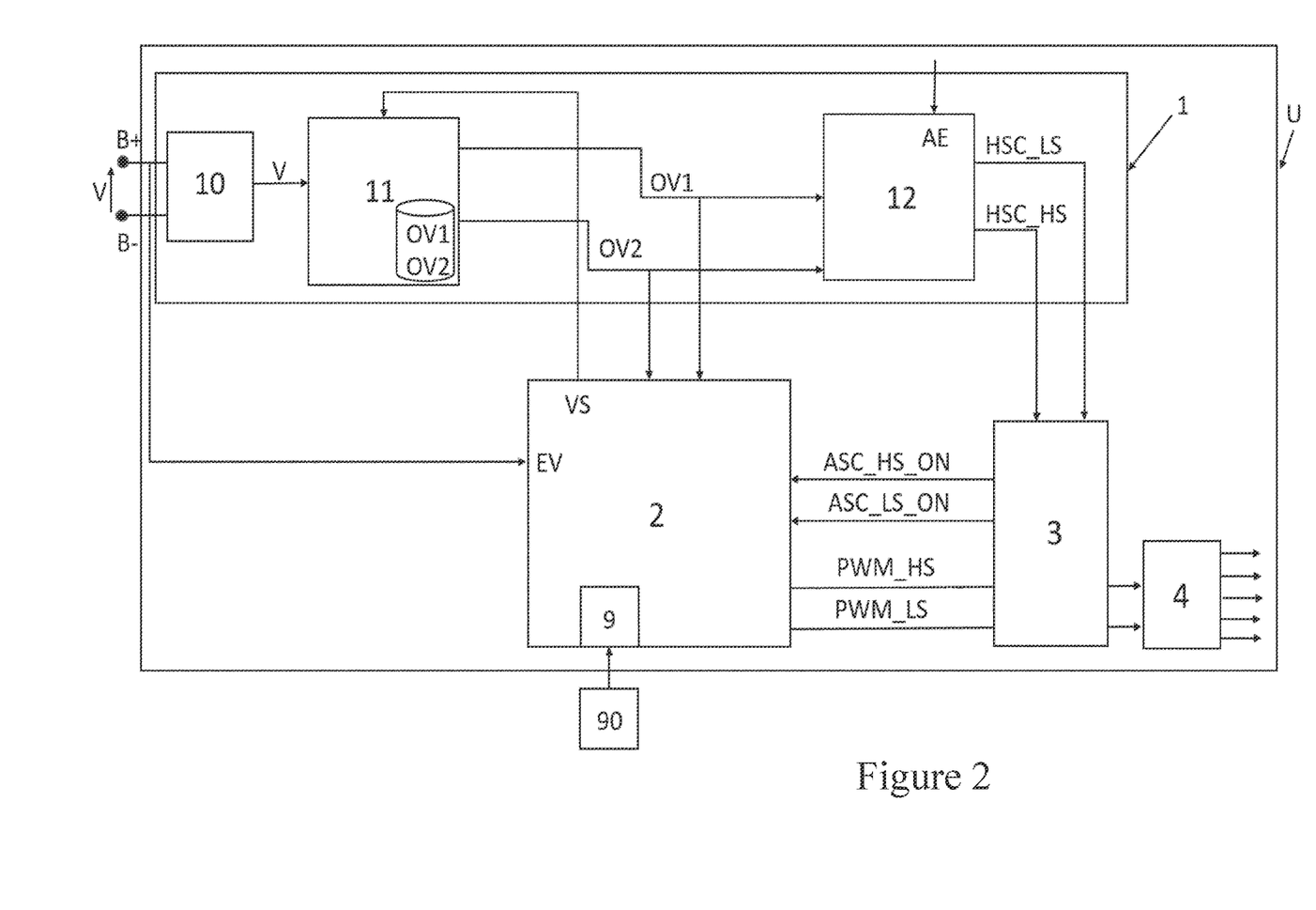
[FIG. 2] shows a block diagram of a control unit comprising a control system according to one example of the first embodiment.

[FIG. 2] shows a block diagram of the control unit U.

The control unit U comprises a control system 1 comprising a module 10 for measuring a voltage of the DC voltage source B. In the example described here, the measurement module 10 measures a voltage V across the terminals B+ and B−. In other words, in the example described here, the voltage module 10 measures the voltage of the DC voltage source B which has a nominal voltage of 48 volts.

The control system 1 further comprises a comparison module 11 arranged to receive, from the measurement module 10, the measured voltage V. The comparison module 11 compares the measured voltage V with a first safety threshold OV1. The first safety threshold OV1 is for example stored in a non-volatile memory of the comparison module 11.

In the example described here, the first safety threshold OV1 is between 1.10 and 1.25 times the nominal voltage, for example 1.2 times the nominal voltage of the DC voltage source corresponding for example to that of the on-board network of the vehicle. In this case, in this example, the safety threshold OV1 is 56 volts or about 1.17 times the nominal voltage of the 48 volt DC voltage source.

The comparison module 11 is further designed to compare the measured voltage V with a second safety threshold OV2 higher than the first safety threshold OV1. The second safety threshold OV2 is for example stored in a non-volatile memory of the comparison module 11.

The control system 1 further comprises a control module 12. In the example described here, the control module 12 is based on logic gates. As a variant, the control module 12 may be a microcontroller.

The comparison module 11 is arranged to transmit, to the control module 12, information ov1 when the measured voltage V is higher than the first safety threshold OV1. This information ov1 is for example transmitted in the form of a high logic level when the measured voltage V is higher than the first safety threshold OV1, and a low logic level otherwise.

The comparison module 11 is also arranged to transmit, to the control module 12, information ov2 when the measured voltage V is higher than the second safety threshold OV2.

This information ov2 is for example transmitted in the form of a high logic level when the measured voltage V is higher than the second safety threshold OV2, and a low logic level otherwise. In the example described here, the second safety threshold is equal to 64 volts, i.e. 33% higher than the 48 V nominal voltage.

On receiving the information ov1, the control module 12 sends a command to close a first group of switches LS, HS, chosen from the group of the high-side switches HS, i.e. the high group, or the group of the low-side switches LS, i.e. the low group.

In the example described here, the first group of switches is the low group LS and the command is a command ASC_LS to close all of the switches of the low group LS.

Optionally, on receiving the information ov1, the control module 12 may also send a command to open a second group of switches LS, HS, chosen from the group of the high-side switches HS, i.e. the high group, or the group of the low-side switches LS, i.e. the low group, the second group of switches being different from the first group. In this case, the switching of each of the arms X, Y and Z is subject to a dead time during which the high and low switches of the arm are both open. In particular, the objective is that the switch the opening of which is controlled is indeed open before controlling the closing of the other switch in order to ensure that there is no "cross-conduction" according to the expression known to those skilled in the art, meaning that the high and low switches are simultaneously closed.

In the example described here, the second group of switches is the high group HS and the control module 12 may also send a command to open all of the switches of the high group HS.

On receiving the information ov2, the control module 12 sends a command to close the second group of switches. In this case, in the example described here, the switches of the second group are therefore the switches of the high group HS and the command is a command ASC_HS to close all of the switches of the high group HS.

Optionally, on receiving the information ov2, the control module 12 may also send a command to open the first group of switches. In this case, in the example described here, the switches of the first group are therefore the switches of the low group LS and the command is a command to open all of the switches of the low group LS. In this optional case, the switching of each of the arms X, Y and Z is subject to a dead time.

Thus, in the example described here, in the event of the occurrence of an overvoltage, the control module 12 first transmits a command to close all of the low-side switches (low group LS) and potentially a command to open all of the high-side switches (high group HS).

In [FIG. 1], the switches of the low group LS are closed and the switches of the high group HS are open. Thus, it can be seen in [FIG. 1] that all of the phases U, V, W are put at the same potential, in this case at the potential of the ground of the vehicle B−. Thus, the electrical system SE is protected if the fault originated from a faulty high-side switch that remained open "remained in open state fault" or if the fault originated from a faulty low-side switch that remained closed "remained in closed state fault", or if the fault originated from another item of equipment on the on-board network, such as for example an untimely disconnection of the first DC power source B while the rotary electric machine was in generator mode.

If the measured voltage V stabilizes without exceeding the second threshold OV2, the converter is then in a satisfactory state, i.e. in a state in which the overvoltage has been brought under control and in which the converter is protected from the consequences of the overvoltage. In other words, the control system 1 has applied the correct strategy of shorting the switching arms of the voltage converter O with regard to the type of the fault that caused the overvoltage.

It should be noted that the second threshold has to be configured so as to be far enough from the first threshold to allow time for the overvoltage to stabilize below the second threshold when shorting the switches of the first group is the correct strategy to be implemented with respect to the type of fault that caused the overvoltage.

Otherwise, if the control system 1 has not applied the correct strategy of shorting the switching arms of the voltage converter O, the measured voltage V continues to increase until it exceeds the second threshold OV2. When the second threshold OV2 is exceeded, the control module 12 then transmits a second command to close all of the high-side switches (high group HS) and potentially a second command to open all of the low-side switches (low group LS).

At this stage, the control system 1 has necessarily applied the correct strategy of shorting the switching arms of the voltage converter O. Thus, the overvoltage has been brought under control and the converter is protected from the consequences of this overvoltage.

Optionally, the control module 12 may also comprise one or more inputs AE arranged to receive error information, for example error information relating to a voltage on the on-board network that is too low (undervoltage or UV). On receiving error information over the one or more inputs AE, the control module 12 also sends a command to close the first group of switches and potentially a command to open the second group of switches.

In the embodiment described here, the control unit U further comprises a machine control module 2, a logic module 3 and a controller 4 also known as a "driver".

The machine control module 2 comprises an input (not shown) for receiving, from an electronic control unit of the vehicle, an instruction either to switch the rotary electric machine to motor mode according to a supplied torque value, or to switch the rotary electric machine to alternator mode according to a resistive torque in order to charge the DC voltage source of the vehicle. The machine control module 2 transforms this instruction into a command for the high-side HS and low-side LS switches, said command being transmitted by way of the logic module 3 and the controller 4. In other words, by virtue of the machine control module 2, of the logic module 3 and of the controller 4, the high-side switches HS and the low-side switches LS each receive a command, for example via pulse-width modulation PWM_HS, PWM_LS, to open or close.

The logic module 3 is designed to prioritize the commands sent by the control system 1 over commands sent by the machine control module 2. In other words, the control system 1 has priority over the machine control module 2.

The logic module 3 therefore receives the command either from the machine control module 2 or from the control system 1 in order to deliver it to the controller 4.

The logic module 3 therefore prioritizes the sending of the command received from the control module 12 over the commands received from the machine control module 2. In other words, when the logic module 3 receives a command from the control module 12, it transmits this to the controller 4 and at the same time does not transmit the commands received from the machine control module 2 to the controller 4.

When the machine control module 2 is a microprocessor and when the control module 12 and the logic module 3 are based on logic gates, the reaction time of the machine control module 2 (typically of the order of ten microseconds) is longer than the reaction time of the control module 12 (typically of the order of a microsecond). Thus, the prioritization performed by the logic module 3 ensures that the voltage converter O and the rotary electric machine M are made safe faster.

The logic module 3 may further send information ASC_LS_ON, ASC_HS_ON, for example in the form of a logic level, to the machine control module 2 in order to inform this machine control module 2 that the control module 12 has controlled the closing of the switches of the first group or of the second group.

In this embodiment of the invention, the machine control module 2 may further be connected to the measurement module 11. Thus, in this case, the measurement module 11 may transmit the information ov1 or ov2 to the machine control module 2 which may thus:

1. check that the closing of the switches of the first group or of the second group by the control module 12 is not an error, and/or
2. transmit, to the logic module 3, the command to close the switches of the first group and then, if necessary, the command to close the switches of the second group.

Thus, the dual transmission of the command to close the switches of the first group and, if necessary, of the second group makes it possible to have redundancy in control and to ensure a higher level of safety for the voltage converter 1, in particular in the case when the control module 12 is faulty.

The machine control module 2 may further optionally comprise an input EV for measuring the voltage of the voltage source which is, in this example, the voltage V measured by the measurement module 10. Thus, the machine control module 2 is able to check the operation of the measurement module 10. In addition, this allows the machine control module 2 to be able to resume in a normal mode when the measured voltage V decreases, for example when the engine control module 2 additionally receives information from the electronic control unit of the vehicle that the overvoltage came from an item of equipment other than the voltage converter O.

The machine control module 2 may further optionally comprise an output VS connected to the comparison module 11 so as to force the comparison module 11 to indicate, to the control module 12, that the measured voltage is higher than the first threshold or than the second safety threshold in order to check that the control system 1 is operational.

The machine control module 2 may optionally further comprise other safety or fault detection modules for detecting or anticipating an overvoltage. For example, the machine control module 2 may comprise a phase-current direction fault module 9. The fault module 9 is connected to a sensor 90 that measures the direction of the phase current. In the event that the phase current goes in the wrong direction, it may lead to an overvoltage. Thus, when the machine control module 2 receives information from this safety module 9, the machine control module 2 directly controls the switches of the first group so as to close and, optionally, the switches of the second group so as to open.

Figure 3:
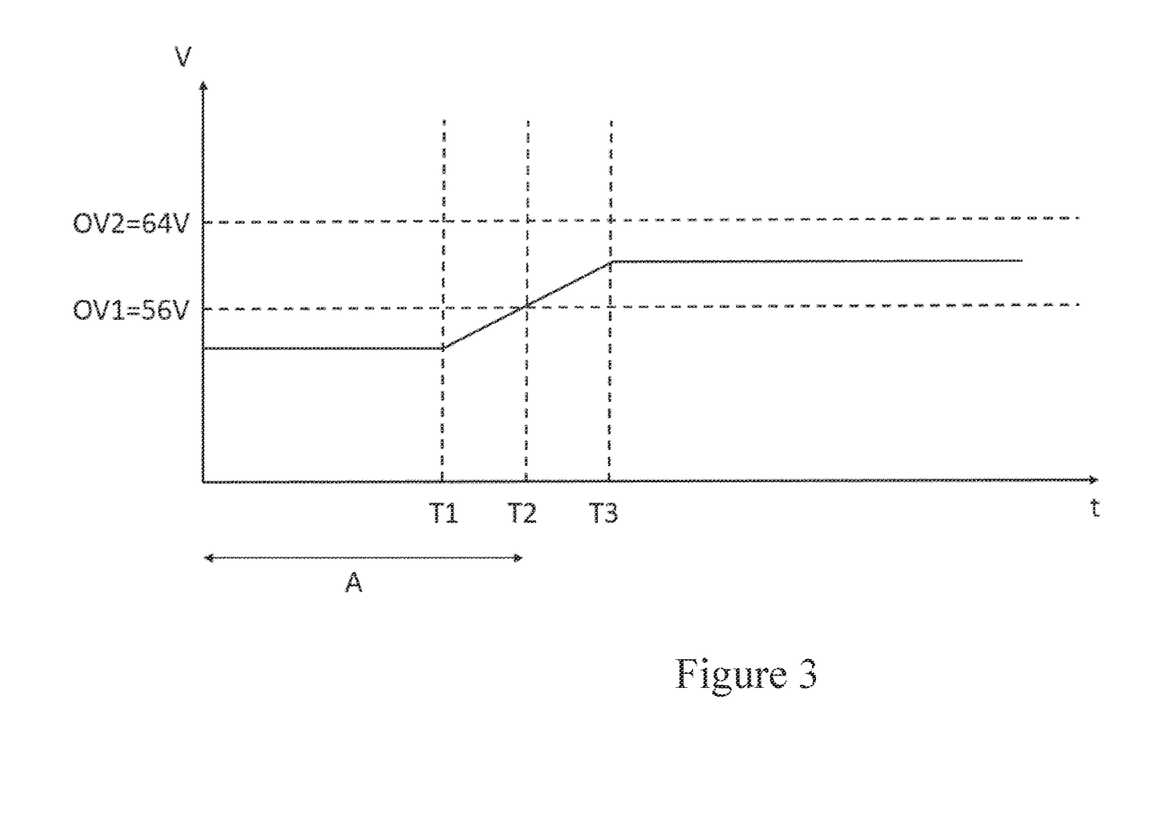
[FIG. 3] and [FIG. 4] show a histogram showing the voltage measured across the terminals of a DC voltage source.

Now described, with reference to [FIG. 3], is the change in the voltage V measured across the terminals B+ and B– in the case when an untimely disconnection of the first DC power source B occurs.

In the histogram, over a "Normal" period A, the voltage converter O controls the high-side and low-side switches normally according to the instruction from the electronic control unit of the vehicle. Over this period A, the measured voltage V is lower than the first safety threshold OV1, in particular, for a first duration, it is equal to the nominal voltage of the DC voltage source, in this case 48 volts. Over this period A, at a time T1, the first DC power source B disconnects from the on-board network while the rotary electric machine is in generator mode. This disconnection generates a load-dump effect which causes an overvoltage on the on-board network.

Following this disconnection, at a time T2, the measured voltage V exceeds the first safety threshold OV1, in this case 56 volts.

The comparison module 11 of the control system 1 then sends the control module 12 the information ov1 according to which the measured voltage V is higher than the first safety threshold OV1. On receiving this command, the control module 12 controls the switches of the first group so as to close and the switches of the second group so as to open. In this case, in this example, the control module 12 sends the logic module 3 a command ASC_LS to close the low-side switches in order to ground the phases and a command to open the high-side switches. The logic module 3 retransmits, regardless of the commands also sent by the machine control module 2, these commands to the controller 4 in order to control the switches of the low group LS so as to close and the switches of the high group HS so as to open.

It can be seen in the histogram of [FIG. 3] that the measured voltage V continues to rise until a time T3 and then stabilizes at a voltage value between the first safety threshold OV1 and the second safety threshold OV2.

This stabilization shows that the control system 1 has applied the correct strategy of shorting the switching arms of the voltage converter O with regard to the type of the fault that caused the overvoltage.

Figure 4:
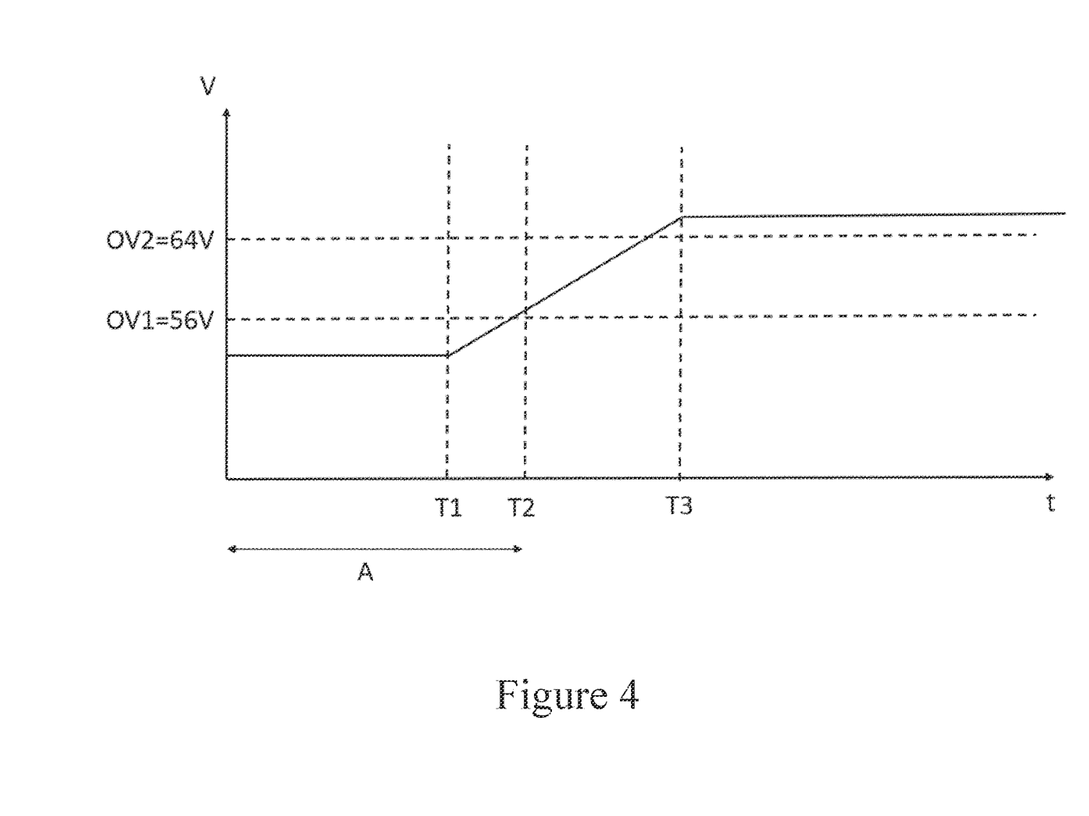

Now described, with reference to [FIG. 4], is the change in the voltage V measured across the terminals B+ and B– in the case when a low-side switch of the voltage converter O remains open.

In the histogram, over a "Normal" period A, the voltage converter O controls the high-side and low-side switches normally according to the instruction from the electronic control unit of the vehicle. Over this period A, the measured voltage V is lower than the first safety threshold OV1, in particular, for a first duration, it is equal to the nominal voltage of the DC voltage source, in this case 48 volts. Over this period A, at a time T1, one of the low-side switches of the voltage converter O gets stuck in an open state.

Following this fault appearing on this low-side switch, at a time T2, the measured voltage V exceeds the first safety threshold OV1, in this case 56 volts.

The comparison module 11 of the control system 1 then sends the control module 12 the information ov1 according to which the measured voltage V is higher than the first safety threshold OV1. On receiving this command, the control module 12 controls the switches of the first group so as to close and the switches of the second group so as to open. In this case, in this example, the control module 12 sends the logic module 3 a command ASC_LS to close the low-side switches in order to ground the phases and a command to open the high-side switches. The logic module 3 retransmits, regardless of the commands also sent by the machine control module 2, these commands to the controller 4 in order to control the switches of the low group LS so as to close and the switches of the high group HS so as to open.

It can be seen in the histogram of [FIG. 4] that the measured voltage V does not stabilize and continues to increase until it reaches and then exceeds a voltage value higher than the second safety threshold OV2.

This continuous rise in the measured voltage V shows that the control system 1 has not applied the correct strategy of shorting the switching arms of the voltage converter O with regard to the type of the fault causing the overvoltage.

This is because the faulty low-side transistor remained open and at least one phase of the rotary electric machine was not shorted to ground.

Since the measured voltage V exceeds the second safety threshold OV2, in this case 64 volts, the comparison module 11 of the control system 1 then sends the control module 12 the information ov2 according to which the measured voltage V is higher than the second safety threshold OV2. On receiving this command, the control module 12 controls the switches of the second group so as to close and the switches of the first group so as to open. In this case, in this example, the control module 12 sends the logic module 3 a command ASC_HS to close the high-side switches and a command to open the low-side switches. The logic module 3 retransmits, regardless of the commands also sent by the machine control module 2, these commands to the controller 4 in order to control the switches of the low group LS so as to open and the switches of the high group HS so as to close.

It can be seen in the histogram of [FIG. 4] that the measured voltage V continues to rise until a time T3 and stabilizes at a voltage value higher than the second safety threshold OV2.

This stabilization shows that the control system 1 has applied the correct strategy of shorting the switching arms of the voltage converter O with regard to the type of the fault that caused the overvoltage.

The embodiment described above may not comprise one or more of the functionalities described above as optional.

Of course, the invention is not limited to the embodiments described with reference to the figures, and alternative embodiments could be envisaged without departing from the scope of the invention.

Thus, in the embodiment described above, the switches of the first group are the low-side switches and the switches of the second group the high-side switches but, as a variant, the switches of the first group may be the high-side switches and the switches of the second group the low-side switches.

Likewise, the rotary machine described above is a three-phase machine. As a variant, the rotary electric machine may more generally have n phases, for example n=6 for a six-phase machine. In this case, the voltage converter O also comprises n switching arms.

Likewise, in the embodiment described above, the coils u, v, w are connected in star configuration. As a variant, the coils u, v, w may be connected in delta configuration.

Likewise, in the embodiment described above, the logic module 3, the control module 12 and the machine control module 2 are embodied as distinct entities. As a variant, the logic module 3, the control module 12 and the machine control module 2 may be embodied as a single entity, for example a microcontroller comprising a programmable logic circuit, for example of FPGA ("field-programmable gate array") type.

Furthermore, in the embodiment described above, the high-side and low-side transistors are MOSFETs. As a variant, these transistors may be IGBTs.

The invention claimed is:

1. A system for controlling a voltage converter, the voltage converter being configured to connect a rotary electric machine to a DC voltage source comprising an on-board network, the voltage converter comprising a plurality of switching arms connected in parallel, each arm comprising a high-side switch and a low-side switch connected to one another at a midpoint that is configured to be connected to said rotary electric machine, the high-side switches forming a high group and the low-side switches forming a low group, the control system comprising:
   a module for measuring a voltage of the DC voltage source;
   a comparison module for comparing the measured voltage with a first safety threshold;
   a control module for generating a command to close a first group of switches chosen from the high group or the low group when the comparison module indicates that the measured voltage is higher than the first safety threshold, wherein
   the comparison module is configured to compare the measured voltage with a second safety threshold higher than the first safety threshold and the control module is further configured to, when the measured voltage is higher than or equal to the second safety threshold, generate a second command to close a second group of switches chosen from the high group or the low group, said second group of switches being different from said first group of switches.

2. The control system as claimed in claim 1, wherein the measured voltage is the voltage between two terminals of the voltage converter that are configured to be connected to the DC voltage source.

3. The control system as claimed in claim 1, wherein, when the measured voltage is higher than or equal to the first safety threshold, the control module is further configured to generate a third command to open the switches other than those of the first group.

4. The control system as claimed in claim 1, wherein the control module is further configured to generate a fourth command to open the first group of switches when the measured voltage is higher than or equal to the second safety threshold.

5. The control system as claimed in claim 1, wherein the first group of switches is the low group.

6. An electrical system comprising:
   a first and a second power supply terminal configured to be connected to a DC voltage source to a battery of a motor vehicle;
   a rotary electric machine comprising a stator having at least three phases; and
   a voltage converter for supplying the rotary electric machine with power from said DC voltage source, the voltage converter comprising:
      a plurality of switching arms connected in parallel, each arm comprising a high-side switch and a low-side switch connected to one another at a midpoint, each midpoint being connected to at least one phase of said rotary electric machine, and
      a unit for controlling the high-side and low-side switches, said control unit comprising a control system, the control system comprising
   a module for measuring a voltage of the DC voltage source;
   a comparison module for comparing the measured voltage with a first safety threshold;
   a control module for generating a command to close a first group of switches chosen from the high group or the low group when the comparison module indicates that the measured voltage is higher than the first safety threshold, wherein the comparison module is configured to compare the measured voltage with a second safety threshold higher than the first safety threshold and the control module is further configured to, when the measured voltage is higher than or equal to the second safety threshold, generate a second command to close a second group of switches chosen from the high group or the low group, said second group of switches being different from said first group of switches.

7. The electrical system as claimed in claim 6, wherein the control unit further comprises at least one phase-current direction fault module, and wherein, when the phase-current direction fault module detects a fault, the control unit controls the first group of switches so as to close.

8. The electrical system as claimed in claim 6, wherein the control unit further comprises:
- a controller configured to control the high-side and low-side switches,
- a machine control module configured to receive, from an electronic control unit of the vehicle, an instruction either to switch the rotary electric machine to motor mode, or to switch the rotary electric machine to alternator mode, and arranged to transform this instruction into a command for controlling the high-side and low-side switches of the voltage converter,
- a logic module for prioritizing the commands sent by the control system over the commands sent by the machine control module, the logic module transmitting, to the controller, the command for the switches received either by the machine control module or by the control system.

9. A method for controlling a system for controlling a voltage converter as claimed in claim 1, the voltage converter being connected to a rotary electric machine and to a DC voltage source of an on-board network, said method comprising:
- measuring, by the measurement module, the voltage of the DC voltage source (B),
- comparing, by the comparison module, the measured voltage with a first safety threshold,
- generating, by the control module, a command to close a first group of switches chosen from the high group or the low group, if the measured voltage is higher than the first safety threshold.

\* \* \* \* \*